(12) United States Patent
Pressesky et al.

(10) Patent No.: US 6,483,299 B1
(45) Date of Patent: Nov. 19, 2002

(54) APPARATUS AND METHOD FOR MEASURING MAGNETIC PROPERTIES OF RECORDING MEDIUMS

(75) Inventors: Jason L. Pressesky, Menlo Park, CA (US); Hans Jürgen Richter, Palo Alto, CA (US); Li-Ping Wang, Fremont, CA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 09/708,491

(22) Filed: Nov. 9, 2000

Related U.S. Application Data
(60) Provisional application No. 60/165,104, filed on Nov. 12, 1999.

(51) Int. Cl.[7] .................................................. G01R 33/12
(52) U.S. Cl. ........................................... 324/212; 360/31
(58) Field of Search ................................. 324/210, 212, 324/360, 313; 369/100, 53–56, 284; 360/25, 31

(56) References Cited

U.S. PATENT DOCUMENTS

| | | | |
|---|---|---|---|
| 4,398,203 A | 8/1983 | Cornet | 346/135.1 |
| 4,721,658 A | 1/1988 | Gardner | 428/694 |
| 4,833,043 A | 5/1989 | Gardner | 428/694 |
| 4,847,558 A | 7/1989 | Fisher et al. | 324/212 |
| 4,888,750 A * | 12/1989 | Kryder et al. | 369/13 |
| 4,940,938 A | 7/1990 | Naito et al. | 324/212 |
| 5,161,134 A | 11/1992 | Lee | 369/13.32 |
| 5,237,548 A | 8/1993 | Muchnik | 369/13 |
| 5,293,359 A | 3/1994 | Ohta et al. | 369/13.24 |
| 5,353,268 A | 10/1994 | Hintz | 369/13 |
| 5,389,398 A | 2/1995 | Suzuki et al. | 427/130 |
| 5,390,162 A | 2/1995 | Fukumoto et al. | 369/116 |
| 5,462,811 A | 10/1995 | Miyamoto et al. | 428/694 |
| 5,574,703 A * | 11/1996 | Shimokawato et al. | 369/13 |
| 5,598,387 A | 1/1997 | Pohl | 369/44.37 |
| 5,781,513 A * | 7/1998 | Fuji | 369/13 |
| 5,963,029 A * | 10/1999 | Pressesky | 324/212 |

* cited by examiner

*Primary Examiner*—Edward Lefkowitz
*Assistant Examiner*—Reena Aurora
(74) *Attorney, Agent, or Firm*—Morrison & Foerster LLP

(57) ABSTRACT

An apparatus and a method for measuring the magnetic properties of recording media. Particularly, the invention is directed to the measurement of the coercivity of recording media having high coercivity values. The apparatus for measuring the magnetic properties of recording media contains a thermal source to increase the temperature of a selected portion of the recording media, thus temporally decreasing the coercivity of the recording media in the selected portion. Magnetic transitions are induced by applying a magnetic field to the regions of the medium affected by the thermal source. The electromagnet applies an incrementally increasing DC field to the selected portion to generate variable magnetization data.

18 Claims, 5 Drawing Sheets

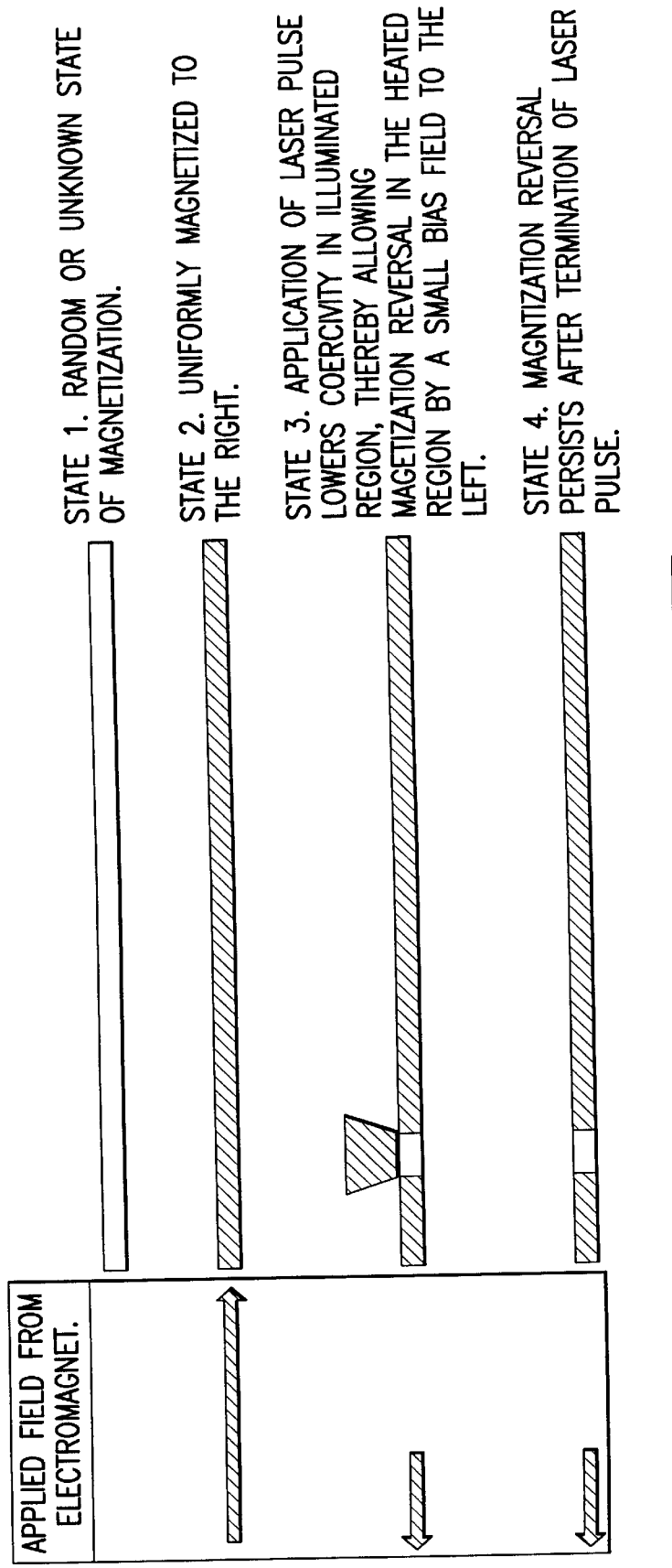

APPARATUS AND METHOD FOR MEASURING MAGNETIC PROPERTIES OF RECORDING MEDIUMS

RELATED APPLICATIONS

This application claims priority from U.S. Provisional Application Ser. No. 60/165,104 filed Nov. 12, 1999, entitled "Method and Apparatus For Measuring Magnetic Properties," the entire disclosure of which is hereby incorporated herein by reference.

FIELD OF THE INVENTION

The present invention relates to an apparatus and method to measure magnetic properties of data recording media, particularly the coercivity of the recording media.

BACKGROUND

Rotating disc magnetometry (RDM) is a useful method for measuring the magnetic properties of magnetic recording discs. The method is both rapid and non-destructive. One challenge of constructing a useful, non-contact, rotating disc magnetometer is the availability of writing heads that are capable of fully saturating the relatively high coercivity materials used in high capacity magnetic storage systems. The coercivity of typical recording media used in disc drives is about 3000 Oe. It is projected that this number will rise within the next year to about 4000 Oe. Further increases to perhaps as much as 6000 Oe are anticipated over the next several years. Media with coercivities in excess of 4000 Oe are difficult to saturate with currently available large-scale writing heads operated at mechanical clearances of 0.075 mm from the disc surface. Therefore, if RDM is to be used in the near future to measure recording media with ever increasing coercivity vastly improved writing heads are required.

A rotating disc magnetometer generally comprises a rotating support to maintain the recording medium to be measured, a recording head containing a transducer that can be selectively positioned over the recording medium, and a programmable control unit. The transducer has many roles in measuring the magnetic properties of the recording medium. The transducer applies magnetic fields to write magnetic transitions (data) onto the recording media, senses the resulting fringing fields to read the data, and applies erasing magnetic fields to remove or erase data previously recorded.

Magnetic media performance depends largely upon magnetic properties of the recording layer. Important properties in this regard include the coercivity, the remanance-thickness product, and the coercive squareness or switching squareness. The coercivity is the magnetic intensity of an applied magnetic field sufficient to cause the recording media to undergo a transition from a state of magnetic saturation to a non-magnetized state. The remanance-thickness product indicates the density of magnetic poles in the remanent state and thus relates to the strength of the electrical signal recoverable from a magnetization transition. The coercive squareness or switching squareness describes the rate of change of magnetization as a function of an applied magnetic field.

There are several known approaches to testing magnetic media for their magnetic properties, including vibrating sample magnetometers for measuring magnetization as a function of an applied magnetic field, and hysteresis testers for measuring flux density as a function of an applied field. These devices, however, are destructive in that they require cutting or otherwise separating a finite element from the recording medium for measurement.

U.S. Pat. No. 4,847,558, assigned to the assignee of this application, discloses a non-destructive approach for determining coercive force (i.e., coercivity). In particular, a standard read/write head (magnetic induction transducer) supported on an air bearing, is used to generate currents of increasing strength and thereby apply erasing magnetic fields of increasing strength to previously recorded transitions. The magnetic intensities of the applied erasing fields are calculated based on an assumed linear current-field relationship as compared to the signal level before applying the erase current.

In order to write on 6000 Oe recording media, and therefore, to measure the magnetic properties of the recording medium, improvements in writer gap fields of 50% are required with the present technology. It is not likely that such a large improvement can be made. Therefore, an improved device and method of producing fully saturated magnetic transitions is required.

SUMMARY OF THE INVENTION

This invention is directed to an apparatus and of a method for measuring the magnetic properties of recording media. Particularly, the invention is directed to an apparatus and of a method for measuring the coercivity of disc recording media.

The measuring apparatus of the invention contains a directed thermal source to increase the temperature in a selected portion of recording media; an electromagnet to apply external magnetic fields of variable magnitude to the recording media; and a recording head to detect a magnetization signal resulting from magnetic transitions induced by the thermal source and external magnetic fields on the recording media. The apparatus may also include a programmer to coordinate the electromagnet, the thermal source and the recording head. The programmer may also be used to store and convert magnetization data, and calculate coercivity values for selected portions of the recording media.

The measuring apparatus will further contain at least one stage to movably adjust the position of the electromagnet and the thermal source to the selected portion of the recording media. Preferably, another stage is used to movably adjust the position of the recording head to the same selected portion of the recording media. A drive is used to position the recording medium such that the selected portion that is induced to undergo magnetic transitions by the external magnetic field and thermal source is subsequently rotated into a position so the magnetization signal can be detected by the recording head. In the preferred embodiment, the directed thermal source is a laser and the recording head is a replay transducer. The laser will have a characteristic wavelength between approximately 300 and 2000 nm, preferably between approximately 500 and 1000 nm. It is preferred that the electromagnet be a ring electromagnet such that the recording media passes through the poles of the ring electromagnet. The electromagnet should be of sufficient power to apply an external magnetic field between approximately 0.01 and 20 Tesla, preferably between 0.1 and 4 Tesla.

An embodiment of this invention is an apparatus comprising a directed thermal source to increase the temperature in a selected portion of a recording medium; an electromagnet to apply external magnetic fields to the selected portion of the recording medium; and means for detecting a magnetization signal resulting from magnetic transitions on the selected portion of the recording medium, wherein the magnetization signals are used to measure magnetic properties of the selected portion of the recording medium.

The measuring apparatus of the invention includes: a means for directing a thermal source, preferably a laser, and an external magnetic field to a selected portion of a recording medium; a means for detecting magnetization signals; a means for coordinating the thermal source, the external magnetic fields, and the detection means to the selected portion of the recording medium that is induced to undergo magnetic transitions; and a means for store magnetization data and calculating coercivity values for each selected portion of the recording medium.

The invention is also of a method to measure magnetic properties of a recording medium, the method including: applying a first (strong) external magnetic field such that an effective magnetic field at a selected portion of the recording media is greater than the coercivity of the selected portion of the recording media at ambient temperatures; applying a second (weak) external magnetic field of a magnitude less than the coercivity of the recording media at ambient temperatures; directing a thermal source, preferably a laser, to generate thermal gradients to lower the coercivity of the recording media and assist the inducement of magnetic transitions in the recording media; and detecting magnetization signals on the recording medium with a recording head. Preferably, a ring electromagnet capable of producing external magnetic fields between approximately 0.01 and 2 Tesla is used.

The method of the invention will further include: applying a series of DC erasing fields of increasing incremental magnitude to the recording media; adjusting the position of the electromagnet and the thermal source with respect to a selected portion of the recording media; adjusting the position of the recording head with respect to the selected portion; coordinating the thermal source, the electromagnet, and the recording head with a programmer; and rotating the recording medium with a drive mechanism such that the selected portion of the recording media that is induced to undergo magnetic transitions is subsequently detected by the recording head, preferably a replay transducer. Preferably, the programmer will also digitize and convert the magnetization signals from the recording head, store the magnetization data, and calculate the coercivity values for the selected portions of the recording media.

BRIEF DESCRIPTION OF THE DRAWINGS

The present invention will be better understood by reference to the Detailed Description of the Invention when taken together with the attached drawings, wherein

FIG. 4 is a schematic of thermally assisted transition formation.

DETAILED DESCRIPTION OF THE INVENTION

Figure 1:
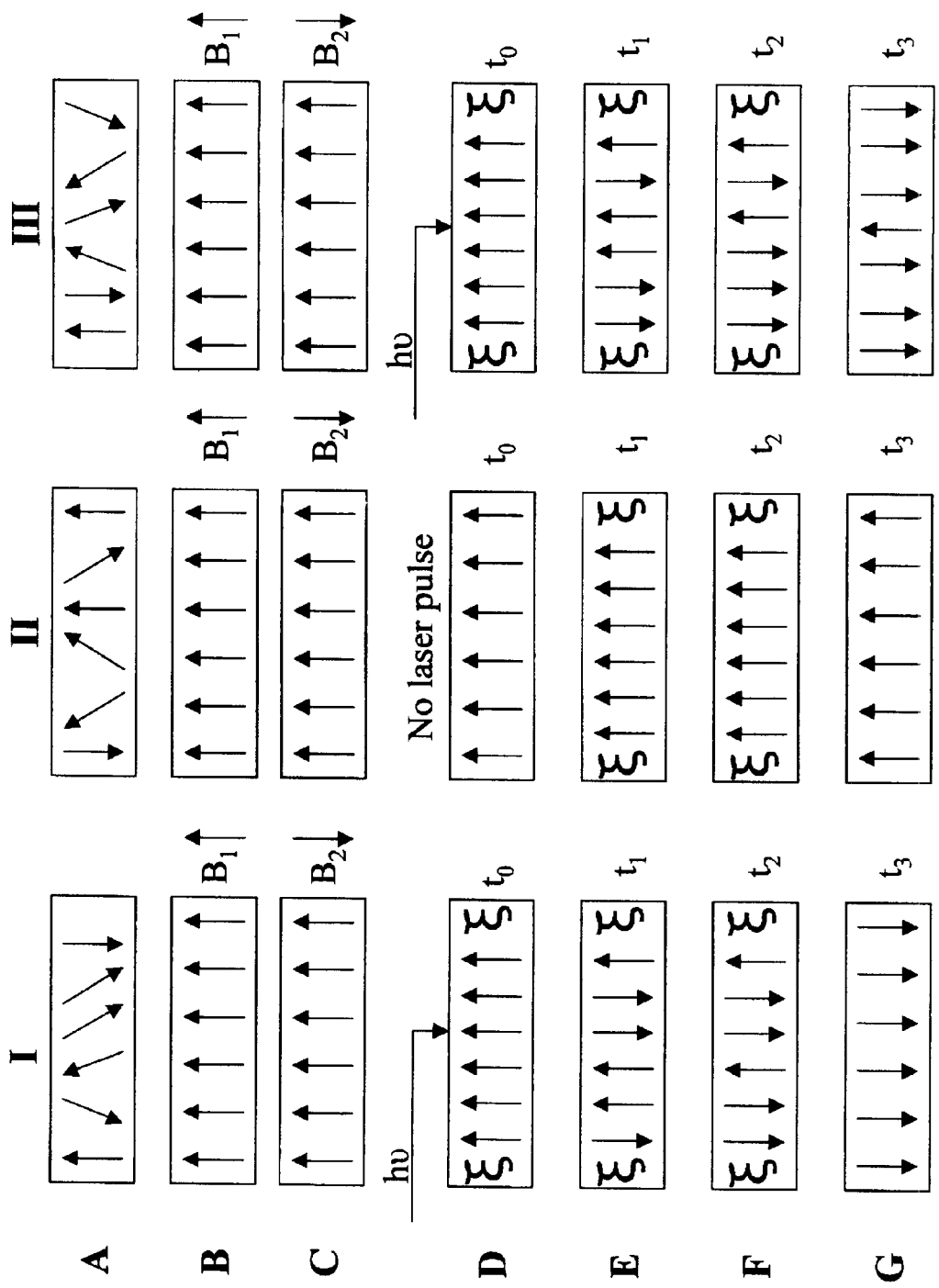
FIG. 1 is a pictorial representation of magnetized states in a selected portion of recording medium with a second applied field of constant polarity.

An embodiment of this invention is a method of causing transitions to be formed in high coercivity disc recording media for the purpose of evaluating the magnetic properties of said recording media. Subsequent to the formation of the transitions, conventional non-contact rotating disc magnetometry methods can be used to complete the non-destructive evaluation of the magnetic properties of the recording medium. The apparatus for causing the transitions, and subsequently completing the magnetic property measurement includes the following components:

1. A device to rotate said recording medium for transition formation and transition readback.
2. An electromagnet of controllable field strength and polarity
3. A device for the delivery of a controlled sequence of precisely metered thermal energy pulses to the region of the disc exposed to the fringing field of the magnetic field source.
4. A device for sensing or detecting the transitions so formed.
5. A computer based controller and software to control and sequence the actions required for transition formation, playback and controlled erasure.

The invention is directed to an apparatus and method used in the measurement of magnetic properties of recording media disposed on a recording medium. Particularly, the invention provides an apparatus and method for measuring the coercivity and/or variations in coercivity around any recorded track on a recording disc member, or measurement of the coercivity at any radial position of the disc member. The invention also is used to measure the remanance thickness product on any recorded track or cylinder and at any radial position. Consequently, the invention allows determination of the basic magnetic properties that determine the recording performance of the recording disc member. The recording member can be any means known in the art including a rotating disc, tape, or rotating cylinder. Additionally, repeating measurements of the coercivity and/ or remanance thickness product at different radial locations provides a means of obtaining a surface map of the basic magnetic variations within a disc-recording member.

The invention measures the magnetic properties of the recording medium by writing a low frequency or long wavelength recording pattern on a disc and measuring the signal amplitude as a function of DC erase current to determine the coercive force. Subsequent calculation of the isolated half pulse width allows determination of the remanance-thickness product of the disc media. A more detailed description for measuring coercivity with a DC erase current is described in U.S. Pat. No. 4,847,558, the disclosure of which is incorporated herein by reference. The coercivity and remanance-thickness product can be measured as a function of track circumference and track radius, thereby determining how the coercivity and/or remanance-thickness product varies along the recording medium. This data can be used to adjust the parameters of the manufacturing process to provide consistent product output.

To measure the magnetic properties of the recording medium magnetic transitions must first be induced in the recording medium. One way of inducing magnetic transitions is by applying an external magnetic field greater than the coercivity of the recording medium in the region to be measured. However, as the coercivity of the recording medium increases above 3000 Oe, it becomes more difficult to induce transitions with an external magnetic field alone. The problem is generally the writing head on a non-contact recording disc medium (see U.S. Pat. No. 5,963,029, incorporated herein by reference). It is fairly easy to generate high fields with the erase magnet.

The invention addresses this problem by thermally assisting the transitions, i.e., the writing process. Once the transitions are induced conventional non-contact rotating disc magnetometry methods, such as applying an incrementally increasing DC erase field as described in U.S. Pat. Nos. 4,847,558 or 5,963,029 can be used to complete the non-destructive evaluation of the magnetic properties of the recording medium.

The magnetic transitions are induced by applying a thermal source in conjunction with an external, weak magnetic field. Preferably, the thermal source is a laser source having a wavelength between approximately 200 and 2000 nm, more preferably between 400 and 1200 nm, and having a power between approximately 10 and 1000 mW, more preferably between 40 and 400 mW. The thermal source increases the temperature in a selected portion of the recording media. As the temperature of the recording media rises, the coercivity of the recording media decreases. As a result, a relatively weak magnetic field applied to the recording media, which would not induce magnetic transitions at ambient temperatures, will induce magnetic transitions at the relatively higher temperature. The weak magnetic field is now of sufficient magnitude such that magnetic transitions are induced in the recording media as the recording media passes through the poles of the electromagnet.

As the temperature of the recording medium decreases, that is, the recording medium cools to ambient temperature, its coercivity increases. Once the coercivity of the recording media is greater than the weak magnetic field magnetic transitions will no longer occur. The magnetic state of the recording media is locked into the recording media. The coercivity of the recording media can then be determined by applying a DC erasing field according to the method described in U.S. Pat. No. 4,847,558.

Ambient temperature is defined as the temperature at which the recording medium is maintained if no thermal source is used to generate thermal gradients in selected portions of the recording media. For example, the ambient temperature of the recording media could be in the range from between −200° C. to 500° C. The thermal source is then used to increase the temperature of the selected portion of the recording media above the ambient temperature.

There are two methods to thermally assist magnetic transitions in the recording media. In the first method, the thermal source is directed to the recording medium for a relatively short period of time. Preferably, a short laser pulse is used to raise the temperature the recording media, and an external magnetic field of constant polarity is used to induce the magnetic transitions. Preferably, the duration of the laser pulse is very short of the order of a microsecond, e.g., about 2 microsecond or less. In the second method, the thermal source is directed to the recording medium for a relatively long period of time. The duration of the thermal source is greater than 2 microsecond. Preferably, a continuous laser is used to irradiate the recording media, and an external magnetic field of alternating polarity is used.

The first method utilizes a relatively strong magnetic field to first align the magnetic spins in a selected portion of the recording media. Once the magnetic spins are aligned with the strong field, the strong field is replaced with a relatively weak magnetic field of opposite polarity from that of the strong magnetic field. This weak field is not of sufficient magnitude to cause transitions to occur in the recording media because the coercivity of the media at ambient temperatures is greater than the effective magnetic field resulting from the weak external field.

An external magnetic field is the actual magnetic field produced by the electromagnet as measured by means known in the art. The effective magnetic field is the magnetic field sensed by an object within a certain region of the external field. The external field is a function of the electromagnet, whereas the effective field is a function of the electromagnet and the internal magnetic field of the object. The effective field sensed by the object also depends upon the position of the object in the external field.

A laser pulse is directed between the poles of the electromagnet by means known in the art. For example, the laser can be directed by a series of shutters, prisms, and or lenses through the poles of the electromagnet. The laser generates localized thermal gradients in a selected portion of the recording media at the moment the recording media passes through the poles of the electromagnet. The localized increase in temperature of the recording media significantly lowers the coercivity of the media to the point where the coercivity is now less than the effective magnetic field. As a result, magnetic transitions are induced in the selected portion of the recording media.

FIG. 1 is a representation of the magnetic states in the recording medium for thermally assisted magnetic transitions according to the first method. Typically, the recording medium to be measured initially exists in a state of unknown or random magnetization (A). A strong magnetic field $B_1$ is applied in one direction, e.g., up or down, relative to the recording medium. For this example, the magnetic field $B_1$ is applied in the up direction. The strong magnetic field is of sufficient magnitude such that the effective magnetic field at the medium surface exceeds the coercivity of the medium at ambient temperatures. As a result, the strong magnetic field orients most if not all of the magnetized states in the recording medium in the up or aligned direction (B). The strong magnetic field is then replaced with a weak magnetic field of opposite polarity. However, the magnitude of this weak field $B_2$ is less than the strong field $B_1$ and less than the expected coercivity of the recording medium (C). As a result, there is no change in the magnetization of the recording medium. A thermal source, preferably a pulse of light from a laser source, is then directed to the recording medium. The thermal source supplies sufficient thermal energy to the medium such that the coercivity of the medium is momentarily reduced below the magnitude of the applied field $B_2$. The thermally affected region of the recording medium is depicted by the squiggly lines (D). This causes a reversal of the magnetization in the thermally affected region over time $t_1$ (E) and $t_2$ (F). However, as the temperature equilibrates to ambient conditions over time $t_3$, the coercivity of the thermally affected region rise above the magnitude of the applied field. As a result, the state of magnetization in the thermally effected region is locked in (G). The magnetic spins may be locked in a single direction as shown in region IG or locked as shown in region IIIG.

The second method of inducing magnetic transitions includes directing a thermal source. The thermal source can be on continuously during writing or pulsed. Preferably, a continuous laser is used such that the entire track of the recording media is irradiated as it passes through the poles of the electromagnet. Again, the thermal source is introduced after nearly all the magnetic spins have been aligned by the strong magnetic field. As the selected portion of the recording media is being heated a relatively weak magnetic field is applied and magnetic transitions are induced. However, in this instance, the weak field is an alternating field. That is, the polarity of the electromagnetic switches with a known frequency. The pulsing of the laser in the first method is essentially substituted by the polarity frequency of the electromagnet in the second method. Note that in both methods of the invention region II of the recording media as depicted in FIGS. 1 and 2 does not undergo magnetic transitions.

Figure 2:
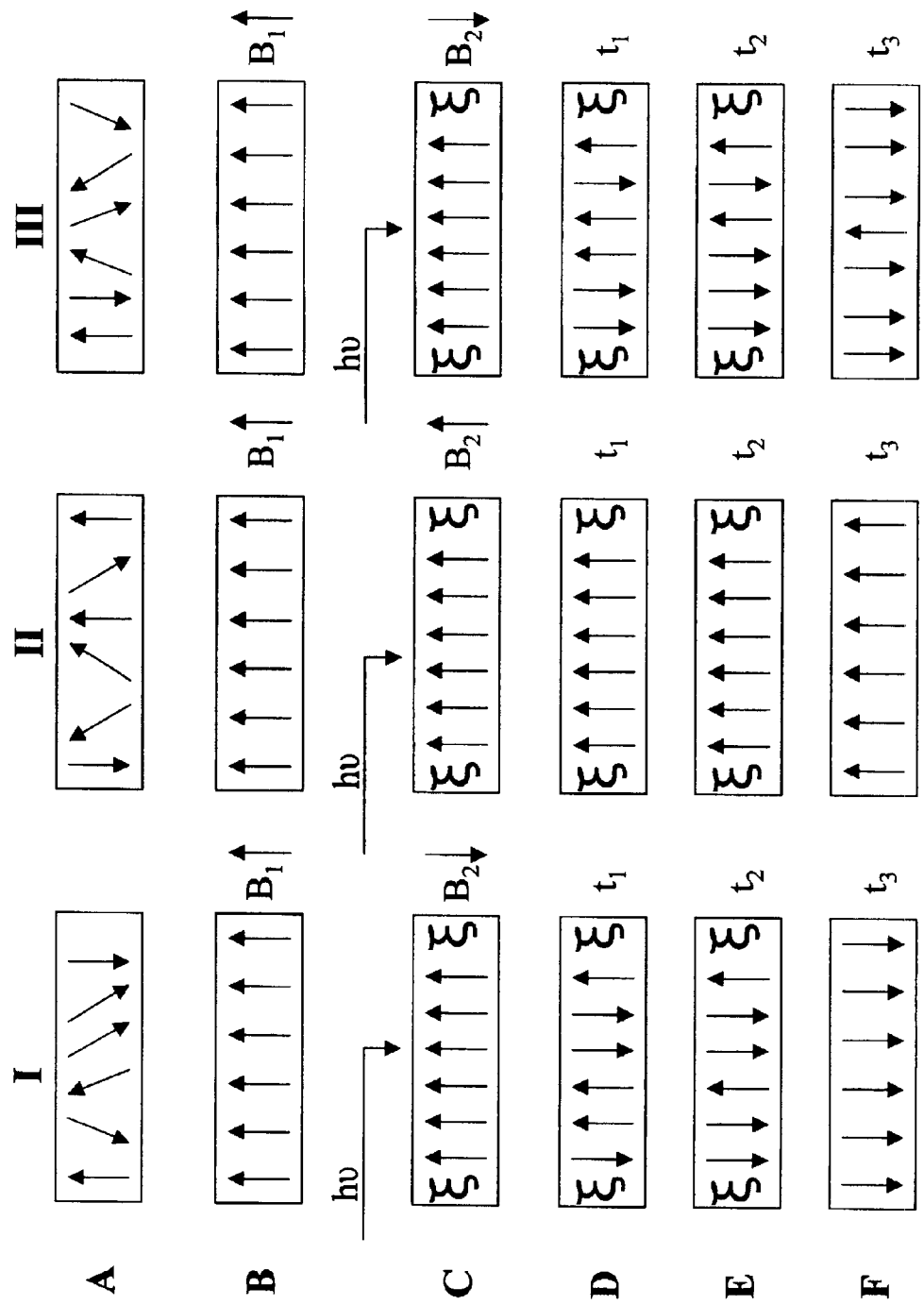
FIG. 2 is a pictorial representation of magnetized states in a selected portion of recording medium with a second applied field of alternating polarity.

The representation of magnetic states and a schematic representation of this second method is shown in FIG. 2. The selected portions of the media (I, II and III) shown in FIG. 2 now correspond to portions that are determined by the frequency of the alternating field rather than the frequency of the laser pulse. As in FIG. 1, three distinct portions of a recording track are depicted. Again, the initial magnetic states for each portion initially exists in a state of unknown or random magnetization (A). A strong magnetic filed $B_1$ is applied as the selected portion of the recording medium passes through the electromagnet. Because this strong field creates an effective field greater than the coercivity of the media most if not all of the magnetized states align with the strong field $B_1$ (B). The thermal source is directed to the poles of the electromagnet generating thermal gradients, i.e., locally increasing the temperature of the recording medium. This is again illustrated by the squiggly lines in the FIG. (C). In the preferred embodiment, the thermal source is of sufficient duration such that most of the selected track is heated during a single revolution. A weak field is then applied to the heated medium. However, rather than being applied at a polarity opposite of the strong field, the polarity of the magnet alternates with a known frequency. Note the direction of the field $B_2$ with respect to regions I, II and III in representation (C). As a result, region II of the medium does not undergo transition because the applied weak field is in the same direction as the initial strong field.

Once the magnetic transitions are induced with the assistance of the thermal source as in method one or two, a DC erase current is applied. The coercivity can then be measured as described in U.S. Pat. No. 4,847,558.

Figure 3A:
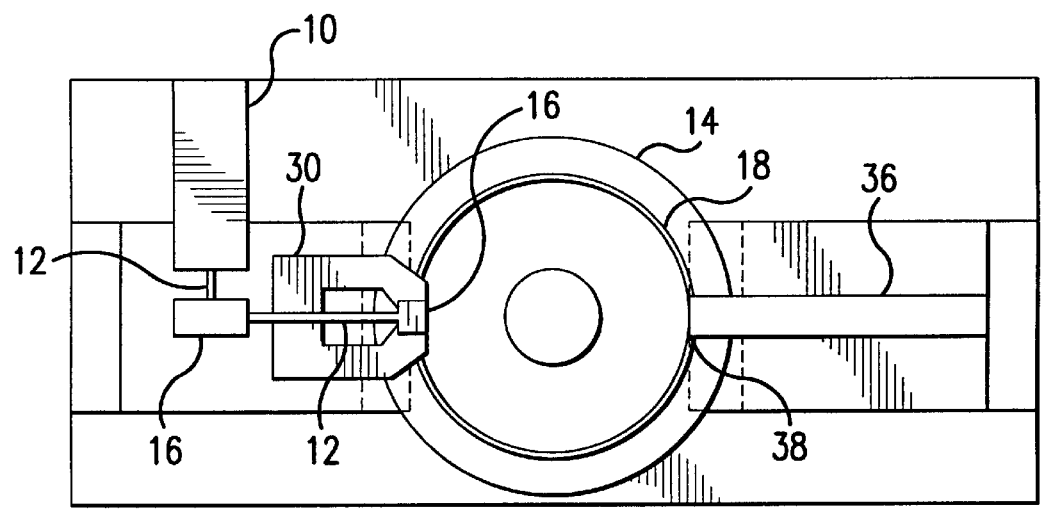
FIG. 3a depicts a top view of the invention.
Figure 3B:
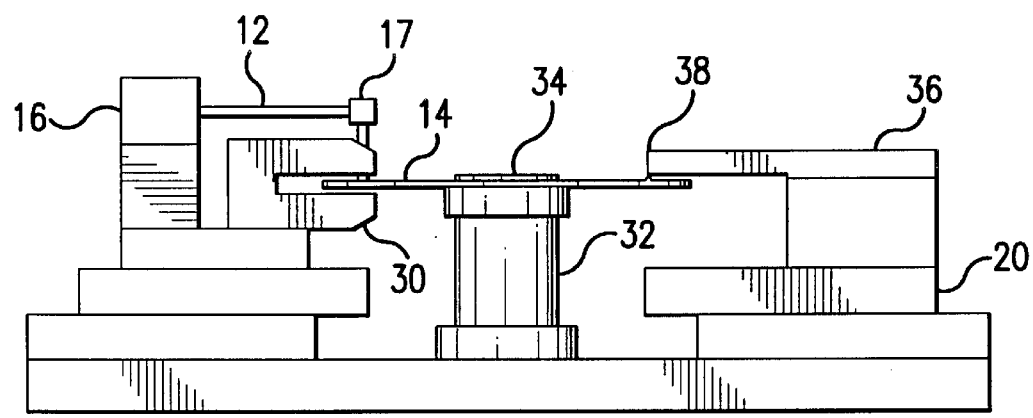
FIG. 3b depicts a side view of the invention.

FIG. 3a and FIG. 3b illustrate one embodiment of the invention. A light source 10, preferably a laser source, generates a light beam 12 of sufficient energy to create thermal gradients in the recording medium 14. The light beam 12 is directed to the recording medium 14 by one or more lenses, mirrors and/or prisms 16 and 17. Other components known in the art, including but not limited to, collimators and shutters may also be used to shape and refine the light beam 12 prior to contacting the recording medium 14. Preferably, the light beam 12 is directed to the portion of the recording medium 14 where the fringing magnetic fields are greatest. In most, if not all cases, the fringing field is greatest about the centerline of the magnet gap and extends radially from the magnet gap. The light beam 12 is directed through a pole tip of an electromagnet 30 where it contacts a selected portion of track 18 on one surface of the recording medium 14. Preferably, the electromagnet will be a ring electromagnet. Any track 18 of the recording medium 14 can be selected to contact the light beam 12 by adjustably moving a translation stage 20. For example, as shown in FIG. 1b, as the stage 20 is moved to the left, a track closer to the perimeter of the recording medium 14 is selected. Similarly, as the stage 20 is moved to the right, a track closer to the center of the recording medium 12 is selected.

As shown in FIG. 2b, the light source 10, lenses, mirrors, prisms, and/or 16 and 17, and the electromagnet 30 are disposed on the stage 20. It is to be further understood that the present invention includes alternative embodiments, including but not limited to, one in which the electromagnet 30 and a lens, mirror or prism 17 are disposed on the stage, while the light source 10 and other mirrors, prisms, lenses and/or shutters 16 are not disposed on the stage 20. In another embodiment the electromagnet 30, light source 10, mirrors, lenses, prisms, collimators and/or shutters 16 and 17 may remain fixed relative to the base 22 of the apparatus and the recording medium 14 may move laterally with respect to the poles of the electromagnet 30 by the transnational movement of the drive mechanism 32.

In the preferred embodiment, the recording medium 14 is disposed on a rotating spindle 34, much like a conventional CD player. The drive mechanism 32 rotates the recording medium 14 such that the selected portion or track 18 is disposed between the poles of the electromagnet 30. To select the desired track 18 the stage 20 moves laterally across the rotating recording medium 14.

It is to be understood that although it is preferred that the laser pass through the poles of the electromagnet as shown in FIG. 3a, the laser can be introduced at any point along the selected track of the recording media. Therefore, the invention includes an embodiment whereby the laser is introduced at one point along the track of the recording media, the electromagnet at a second point, and the recording head at a third point. The purpose of the laser is to increase the temperature of the media at localized portions along the track so the coercivity of the media will drop below the magnitude of the effective magnetic field resulting from the second applied field. As long as the coercivity is less than this effective field magnetic transitions will occur. The advantage of having the laser pass through the poles of the magnet assures that there is little or no thermal equilibration between the time the media is irradiated and the time the irradiated portion passes through the fringing magnetic field.

A recording head 36 comprising a replay transducer 38, is disposed over the recording medium 14 so that the fringing fields from the magnet gap can be detected. The recording head 36 is disposed on a second transnational stage 20', which permits the recording head 36 and consequently the transducer 38 to move laterally across the recording medium 14. In the preferred embodiment the lateral movement of stage 20' coincides with the lateral movement of stage 20 though in a direction opposite to stage 20. This allows the electromagnet 30 to apply a magnetic field to a selected track 18 such that the magnetic field can then be detected on the track 18 with the transducer 38 as the recording medium 14 is rotated.

The transducer 38 is of the type for sensing the magnitude or density of magnetic fields. For example, the transducer 38 may be of the inductive type, magneto-resistive type, or Hall-effect type. The amplitude of this signal is digitized and stored in a computer.

A DC erase field is applied to the recording medium as the recording member rotates back to the electromagnet 30. The amplitude of the magnetization signal is again measured and stored. The DC erase field is incrementally increased as the recording medium rotates between the electromagnet 30 and the transducer 38. The steps of applying increasing erasing magnetic fields and sensing the resulting magnetization of the recording medium are repeated until the signal has decreased to essentially zero. The signal amplitude is plotted as a function of the write field erase magnitude and/or write erase current.

The coercivity of the disc is defined as the magnitude of the DC erase field at a 50% loss in signal value. This is analogous or equivalent to the coercive force obtained from the hysteresis loop measured on a vibrating sample magnetometer, i.e., the field required to reverse half the magnetization. In the M-H loop, the coercivity is defined as the field required to take the sample from a state of saturation to a state of zero magnetization. However, in a state of zero magnetization, the material consists of a multitude of magnetic domains, of which there are an equal number in the positive and negative directions, thereby canceling themselves and yielding a total moment of zero. In the recording situation of the invention, only the transitions contribute to the signal, so the situation is somewhat different. Regions, regions II in FIGS. 1 and 2, whose magnetization are aligned with the direction of the applied DC field (erase field) are stable, since they are saturated in that direction to begin with. The DC erase affects only those regions whose direction of magnetization is opposed to the applied DC erase field. Therefore, the field required to accomplish a 50% reduction in signal (50% switching of allowed domains) is equivalent to the coercivity of the recording medium.

Although the discussion so far has addressed the formation on only one region of the recording medium from one pulse of thermal energy, the process of providing a sequence of thermal energy pulses to the disc surface can be repeated in a manner coordinated with the rotation of the disc such that a sequence of such magnetization transitions are formed and multiple measurements can be made on a single track. Thus, magnetic information, e.g., coercivity variations along the recorded track (azimuthal variations), can be obtained. A programmable delay is used in conjunction with the transducer 38 to provide an array of measurements at different angular positions along the track with respect to some fixed index. Additionally, one can repeat the measurement at different radial locations, thereby obtaining a surface map of coercivity variations over the entire surface of the recording medium.

This invention will be better understood with reference to the following examples, which are intended to illustrate specific embodiments within the overall scope of the invention as claimed.

EXAMPLES

A ring electromagnet capable of producing external fields in the range between 0.01 and 1.2 Tesla was used to apply a strong magnetic field of 0.8 Tesla. A recording medium with an expected coercivity of 5000 Oe at 23° C. was used. The strong magnetic field was then replaced with a weak magnetic field of 0.3 Tesla. A laser pulse was directed to a selected portion of the recording medium. The laser source was a Spectra-Physics V70 producing light with a wavelength of 1,100 nm and a power of 300 mW. The ambient temperature of the recording media was 23° C., and the thermally effected region was about 150 to 200° C.

The magnetization signal or replay signal resulting from the induced magnetic transitions were recorded with a replay transducer (Model No. Bogen DW-10-01). The signal data was then converted and stored with a programmer.

The practice of this invention is further described with reference to FIGS. 3 and 4. Referring to FIG. 3, a pulsed laser source 10 is selected to supply thermal energy to the disc under test. The laser beam shaping and steering module utilizing lenses, mirrors and/or prisms 16 shape the laser beam to the desired profile. The shaped laser beam is further directed between the pole tips of the electromagnet 30 and to the surface of the disc by an additional beam steering device utilizing lenses, mirrors and/or prisms 17 as needed. The laser beam should be directed to the region of the disc surface where the fringing fields from the magnet gap are greatest. A replay transducer 38, such as a ring-type recording head of appropriate design, is positioned over the disc so that fringing fields from the formed magnetic transitions can be sensed. The electromagnet can now be used to supply an incrementally increasing erasing field. Observation of the decay of the replay signal may be used to measure the coercivity and coercivity squareness of the recording medium as described in references R. D. Fisher and J. L. Pressesky, Non-Destructive Method and Apparatus Using DC-Erase Field for Magnetic Measurement of Recording Disc, U.S. Pat. No. 4,847,558 and J. L. Pressesky, Rotating disc magnetometer (RDM), U.S. Pat. application, Seagate Docket Number 2415.01.

The sequence of steps to form the magnetic transitions is described with reference to FIG. 4. Initially, the recording medium is in a state of unknown or random magnetization (Step 1). While the disc is rotating, the electromagnet is used to apply a strong magnetic field in one direction. The field is chosen such that the effective field at the medium surface is in excess of the coercivity of the medium (Step 2). The polarity of the magnetic field of the electromagnet is then reversed and the magnitude of the field is substantially reduced such that it is well below the expected coercivity of the recording medium. A brief pulse from the laser source supplies sufficient thermal energy to the medium such that the coercivity of the medium is reduced below the magnitude of the applied field at the medium. This causes a reversal of the magnetization in the thermally affected region (Step 3). As the temperature equilibrates to ambient conditions, the coercivity of the thermally affected region rise above the magnitude of the applied field; thereby "freezing out" the reversed state of the magnetization in that region (Step 4). Although the discussion so far has addressed the formation on only one reversed region from one pulse of thermal energy, the process of providing a sequence of thermal energy pulses to the disc surface can be repeated in a manner coordinated with the rotation of the disc such that a sequence of such magnetization transitions are formed.

An alternative method of forming magnetization reversals for the purpose of implementing a magnetic property measurement can also be envisioned. In this instance the laser or other light source is operated in a continuous rather than pulsed mode. The duration of the illumination would be one rotation of the disc during which time a magnetic field of alternating polarity and appropriate frequency and magnitude is applied to the desired measurement track. The illumination is arranged to be delivered to a region of the disc that is proximate to the writing head that acts as the source of the writing field. The delay time between illumination and writing must be arranged to be sufficiently short relative to the thermal equilibration time so that the coercivity is reduced during the time of transition formation.

Figure 5A:
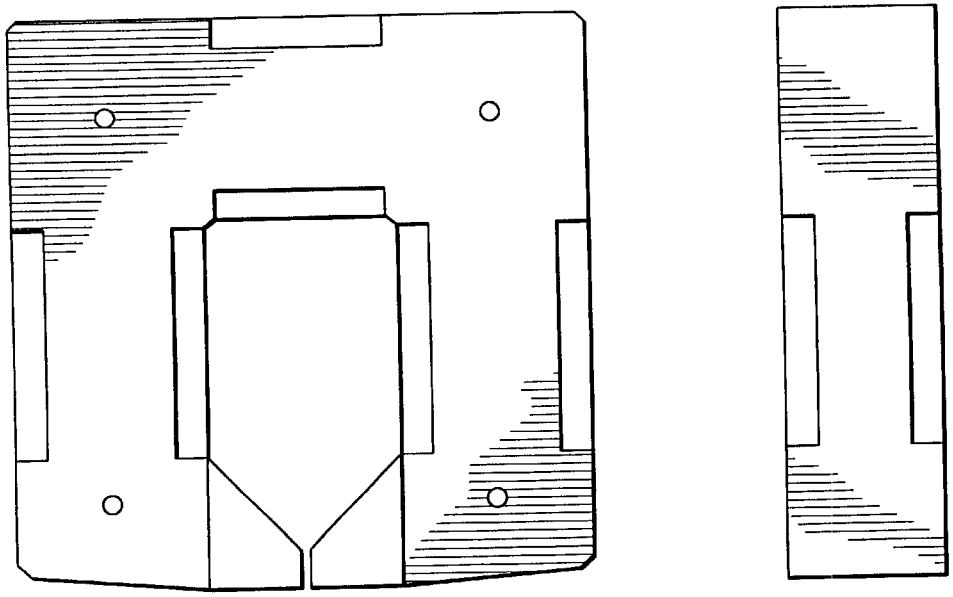
FIG. 5a depicts a perpendicular recording/detecting head.
Figure 5B:
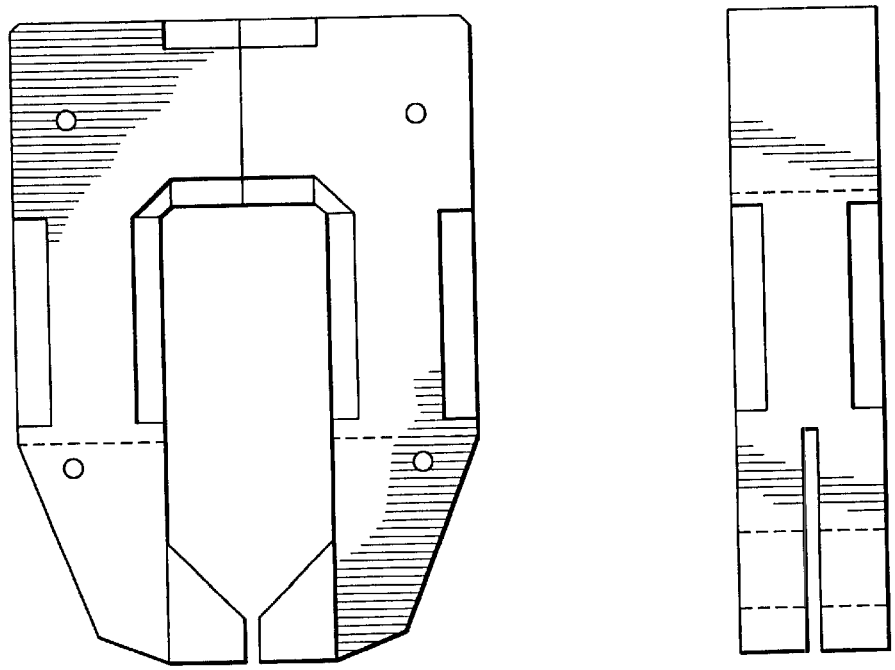
FIG. 5b depicts a slotted recording/detecting head.

The means for detecting a magnetization signal of this invention includes all types of recording/detecting heads used recording media applications. For example, some of the commercially available recording/detecting heads include Bogen DW-10; KA5010-35; and KA510-45. The head could of a perpendicular head, which would be held perpendicular to the disc surface, or a slotted head having a slot into which the disc can be positioned, as shown in FIGS. 5(a) and 5(b).

Having now fully described this invention, it will be appreciated by those skilled in the art that the invention can be performed within a wide range of parameters within what is claimed, without departing from the spirit and scope of the invention. All patents and publication disclosed in this application are incorporated herein by reference.

What is claimed is:

1. An apparatus comprising:
   a directed thermal source to increase the temperature in a selected portion of a recording medium;
   an electromagnet to apply external magnetic fields to the selected portion of the recording medium; and a recording head to detect magnetic transitions in the selected portion of the recording medium, wherein a magnetization signal resulting from said magnetic transitions measures magnetic properties of the selected portion of the recording medium.

2. The apparatus of claim 1, further comprising at least one stage to movably adjust the position of said electromagnet and direct said thermal source to the selected portion of said recording medium.

3. The apparatus of claim 2, further comprising a programmer to coordinate said thermal source, said electromagnet, said recording head, and said at least one stage.

4. The apparatus of claim 2, further comprising a stage to movably adjust said recording head to the selected portion of said recording medium.

5. The apparatus of claim 1, wherein said electromagnet comprises a ring electromagnet such that the selected portion of the recording medium can pass through the poles of the ring electromagnet.

6. A method for measuring magnetic properties of a recording medium, comprising:

applying a first external magnetic field to a selected portion of the recording medium such that an effective magnetic field at the selected portion of the recording medium is greater than a coercivity of the selected portion of the recording medium at an ambient temperature;

applying a second external magnetic field to the selected portion of the recording medium such that an effective magnetic field at the selected portion of the recording medium is less than said coercivity;

directing a thermal source to increase the temperature in the selected portion of the recording medium; and detecting a magnetization signal from the selected portion of the recording medium with a recording head.

7. The method of claim 6, further comprising applying a plurality of DC erase fields of increasing magnitude to the selected portion of the recording medium.

8. The method of claim 7, wherein applying the first external magnetic field, the second external magnetic field, and the plurality of DC erase fields comprises applying said first and second external magnetic fields with a ring electromagnet such that the selected portion of recording medium can pass through the poles of the ring electromagnet.

9. The method of claim 6, further comprising adjusting the position of the first external magnetic field, the second external magnetic field, the directed thermal source, and the recording head with respect to the selected portion of the recording medium with at least one movable stage.

10. The method of claim 9, further comprising coordinating the directed thermal source, an electromagnet, the recording head, and the at least one movable stage with a programmer.

11. The method of claim 10, wherein the programmer digitizes and stores the magnetization signal from the recording head to calculate the coercivity of the selected portion of the recording medium.

12. The method of claim 6, further comprising rotating the recording medium with a drive mechanism.

13. The method of claim 6, wherein directing the thermal source comprises directing a laser having a wavelength between about 300 and 2000 nm.

14. The method of claim 6, wherein the second external magnetic field is of opposite polarity of the first external magnetic field.

15. The method of claim 6, wherein directing the thermal source comprises directing a laser pulse.

16. The method of claim 6, wherein the second external magnetic field is of alternating polarity.

17. The method of claim 16, wherein directing the thermal source comprises directing a laser pulse.

18. An apparatus comprising:

a directed thermal source to increase the temperature in a selected portion of a recording medium;

an electromagnet to apply external magnetic fields to the selected portion of the recording medium; and means for detecting magnetic transitions in the selected portion of the recording medium, wherein a magnetization signal resulting from said magnetic transitions measures properties of the selected portion of the recording medium.

* * * * *